US011139832B1

(12) United States Patent
Kang

(10) Patent No.: US 11,139,832 B1
(45) Date of Patent: Oct. 5, 2021

(54) LDPC DECODER AND OPERATING METHOD THEREOF

(71) Applicant: SK hynix Inc., Gyeonggi-do (KR)

(72) Inventor: Soon Young Kang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/020,257

(22) Filed: Sep. 14, 2020

(30) Foreign Application Priority Data

Mar. 17, 2020 (KR) .................. 10-2020-0032482

(51) Int. Cl.
*H03M 13/00* (2006.01)
*H03M 13/11* (2006.01)
*G06F 11/10* (2006.01)

(52) U.S. Cl.
CPC ..... *H03M 13/1111* (2013.01); *G06F 11/1068* (2013.01); *H03M 13/616* (2013.01)

(58) Field of Classification Search
None
See application file for complete search history.

(56) References Cited

U.S. PATENT DOCUMENTS

| 9,136,877 | B1* | 9/2015 | Chen | H03M 13/1117 |
| 9,755,665 | B1* | 9/2017 | Chilappagari | H03M 13/1105 |
| 10,038,456 | B1* | 7/2018 | Nguyen | H03M 13/1131 |
| 2013/0212447 | A1* | 8/2013 | Li | H03M 13/2957 |
| | | | | 714/763 |
| 2014/0019819 | A1* | 1/2014 | Nakanishi | H03M 13/6325 |
| | | | | 714/752 |
| 2014/0068368 | A1* | 3/2014 | Zhang | H03M 13/658 |
| | | | | 714/752 |
| 2017/0117925 | A1* | 4/2017 | Achtenberg | G06F 11/1072 |
| 2017/0134048 | A1* | 5/2017 | Inbar | H03M 13/1111 |
| 2018/0013446 | A1* | 1/2018 | Milicevic | H03M 13/6505 |

FOREIGN PATENT DOCUMENTS

| KR | 10-2015-0024489 | 3/2015 |
| KR | 10-1610727 | 4/2016 |
| KR | 10-2019-0097331 | 8/2019 |

OTHER PUBLICATIONS

W. Stoye, "LDPC iteration control by partial parity check," 2009 IEEE International Conference on Ultra-Wideband, 2009, pp. 602-605, doi: 10.1109/ICUWB.2009.5288723. (Year: 2009).*

* cited by examiner

*Primary Examiner* — Daniel F. McMahon
(74) *Attorney, Agent, or Firm* — IP & T Group LLP

(57) ABSTRACT

An operating method of a low density parity check (LDPC) decoder, the operating method includes: initially updating codewords to variable nodes; determining an update order in which a plurality of variable node groups are updated, which is determined based on reliability of each of the variable node groups; executing local iterations including update of check nodes associated with a select variable node group among the variable node groups and update of the select variable node group based on the updated check nodes until all the variable node groups are updated based on the update order; performing syndrome check to determine whether LDPC decoding is successful, based on an operation of the updated variable nodes and a parity check matrix.

16 Claims, 13 Drawing Sheets

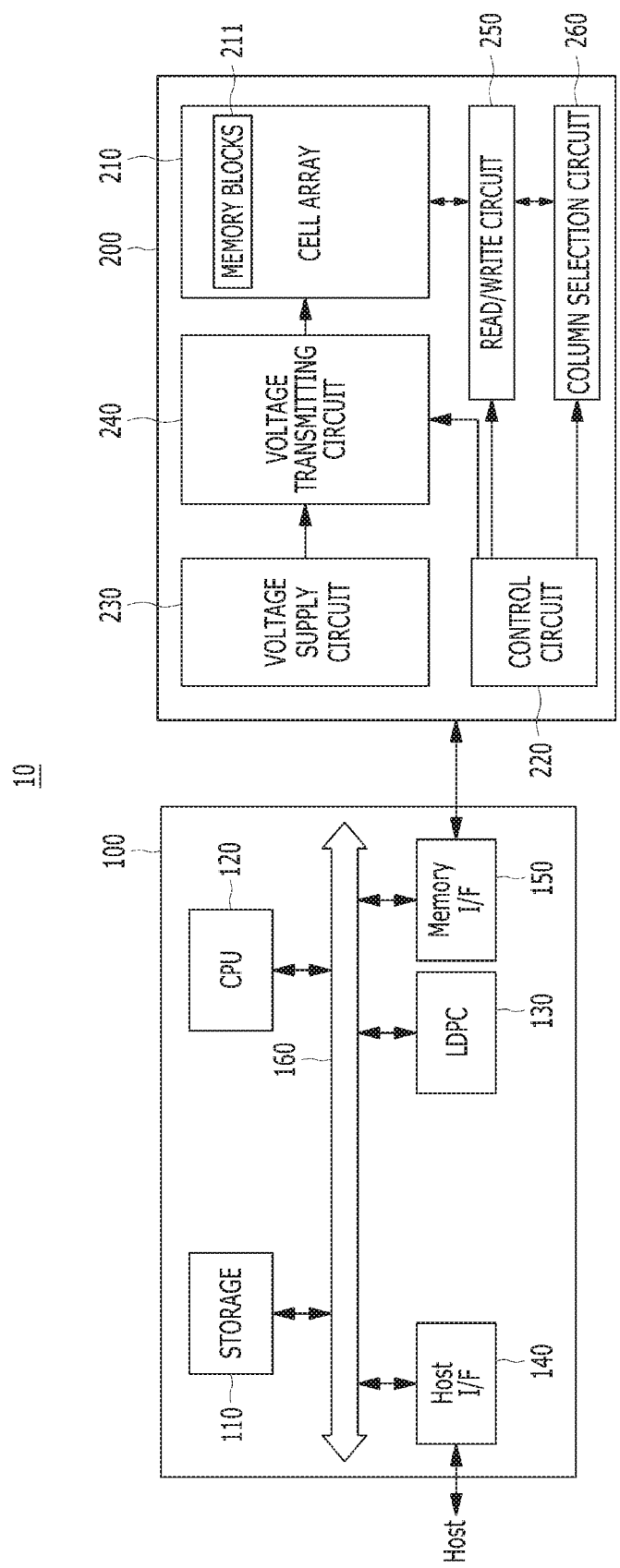

FIG. 6C $\underline{v} = (0\ 1\ 1\ 0\ 0\ 1\ 0\ 1\ 1\ 0\ 0\ 1)$

SYNDROME CHECK $$H\underline{v}^t = \begin{pmatrix} 1 & 1 & 1 & 1 & 0 & 0 & 0 & 0 & 0 & 0 & 0 & 0 \\ 0 & 0 & 0 & 0 & 1 & 0 & 1 & 1 & 1 & 0 & 0 & 0 \\ 1 & 0 & 0 & 0 & 1 & 1 & 0 & 0 & 0 & 1 & 0 & 0 \\ 0 & 1 & 0 & 0 & 0 & 1 & 1 & 0 & 0 & 0 & 1 & 0 \\ 0 & 0 & 1 & 0 & 0 & 0 & 0 & 1 & 0 & 1 & 0 & 1 \\ 0 & 0 & 0 & 1 & 0 & 0 & 0 & 0 & 1 & 0 & 1 & 1 \end{pmatrix} \begin{pmatrix} 0 \\ 1 \\ 1 \\ 0 \\ 0 \\ 1 \\ 0 \\ 1 \\ 1 \\ 0 \\ 0 \\ 1 \end{pmatrix} = \begin{pmatrix} 0 \\ 0 \\ 1 \\ 0 \\ 1 \\ 0 \end{pmatrix} \neq \underline{0}$$

→ PERFORM NEXT ITERATION

LDPC DECODER AND OPERATING METHOD THEREOF

CROSS-REFERENCE TO RELATED APPLICATION

This application claims priority under 35 U.S.C. § 119 to Korean Patent Application No. 10-2020-0032482, filed on Mar. 17, 2020, which is incorporated herein by reference in its entirety.

BACKGROUND

1. Field

Various embodiments relate to a low density parity check (LDPC) decoder and an operating method thereof.

2. Discussion of the Related Art

In general, there are two types of semiconductor memory devices: volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

A volatile memory device loses its stored data when its power is interrupted, whereas a non-volatile memory device retains its stored data even in the absence of power. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data (i.e., 2 or more bits of data) per cell is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions may overlap. As the neighbouring threshold voltage distributions overlap, read data may include error bits.

FIG. 1 illustrates a threshold voltage distribution schematically illustrating program and erase states of a 3-bit MLC (i.e., triple-level cell (TLC)) non-volatile memory device.

FIG. 2 illustrates a threshold voltage distribution schematically illustrating program and erase states due to characteristic deterioration of the 3-bit MLC non-volatile memory device.

In an MLC non-volatile memory device, e.g., an MLC flash memory device capable of storing k-bit data in a single memory cell, the memory cell may have one of $2^k$ threshold voltage distributions. For example, the 3-bit MLC has one of 8 threshold voltage distributions.

Threshold voltages of memory cells programmed for the same data form a threshold voltage distribution due to characteristic differences between memory cells. In the 3-bit MLC non-volatile memory device, as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween. Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. As characteristics of memory cells deteriorate, neighbouring threshold voltage distributions may overlap, as illustrated in FIG. 2.

When neighbouring threshold voltage distributions overlap, read data generated in response to application of a particular read voltage to a selected word line may include a significant number of errors. For example, when a sensed state of a memory cell according to application of a read voltage Vread3 to a selected word line is on, the memory cell is determined to have a second program state 'P2'. When a sensed state of a memory cell according to application of Vread3 to the selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a method for precisely reading data stored in memory cells of a semiconductor memory device.

SUMMARY

Various embodiments are directed to a low density parity check (LDPC) decoder capable of accurately and quickly reading data stored in a memory cell and an operating method thereof.

According to the embodiments of the present disclosure, it is possible to accurately and quickly read data stored in a memory cell of a semiconductor memory device.

In accordance with an embodiment, an operating method of a low density parity check (LDPC) decoder, the operating method includes: initially updating codewords to variable nodes; determining an update order in which a plurality of variable node groups are updated, which is determined based on reliability of each of the variable node groups;

executing local iterations including update of check nodes associated with a select variable node group among the variable node groups and update of the select variable node group based on the updated check nodes until all the variable node groups are updated based on the update order; performing syndrome check to determine whether LDPC decoding is successful, based on an operation of the updated variable nodes and a parity check matrix; and wherein each cycle of the determining of the update order, the executing local iterations and the performing of the syndrome check represents a global iteration, which is repeated until the decoding is successful or the number global iterations performed reaches a maximum number.

In accordance with another embodiment, an LDPC decoder includes: a main decoder configured to initially update codewords to variable nodes; and a scheduler configured to determine an update order in which a plurality of variable node groups are updated, which is determined based on reliability of each of the variable node groups, wherein the main decoder executes local iterations including update of check nodes associated with a select variable node group among the variable node groups and update of the select variable node group based on the updated check nodes, until all the variable node groups are updated based on the update order, and performs syndrome check to determine whether LDPC decoding is successful, based on an operation of the updated variable nodes and a parity check matrix, and wherein each cycle of the determining of the update order, the executing of the local iterations, and the performing of the syndrome check represents a global iteration, which the LDPC decoder repeats until the decoding is successful or the number of global iterations performed reaches a maximum number.

In accordance with an embodiment, the LDPC decoding device includes: a scheduler configured to group a plurality of variable nodes based on error information to generate multiple variable node groups, and determine the order of decoding the variable node groups based on the number of errors associated with each variable node group, such that a variable node group with a higher number of errors is decoded before a variable node group with lower number of errors; and a decoder configured to decode the multiple variable node groups based on the decoding order.

BRIEF DESCRIPTION OF THE DRAWINGS

FIG. 4A is a detailed block diagram illustrating a semiconductor memory system, such as that illustrated in FIG. 3.

FIG. 6C is a diagram illustrating a syndrome check process according to LDPC decoding.

FIG. 76 is a diagram illustrating a 3-bit soft decision read operation as an example of the soft decision read operation illustrated in FIG. 5.

DETAILED DESCRIPTION

Hereinafter, embodiments of the present disclosure are described with reference to the accompanying drawings. However, the present invention may be implemented in other different forms. Thus, the present invention is not limited to the embodiments disclosed below, nor to any specific detail herein. The disclosed embodiments are provided to enable those skilled in the art to completely understand the scope of the present disclosure and to practice the present invention, which is defined by the claims of the present application. Also, throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
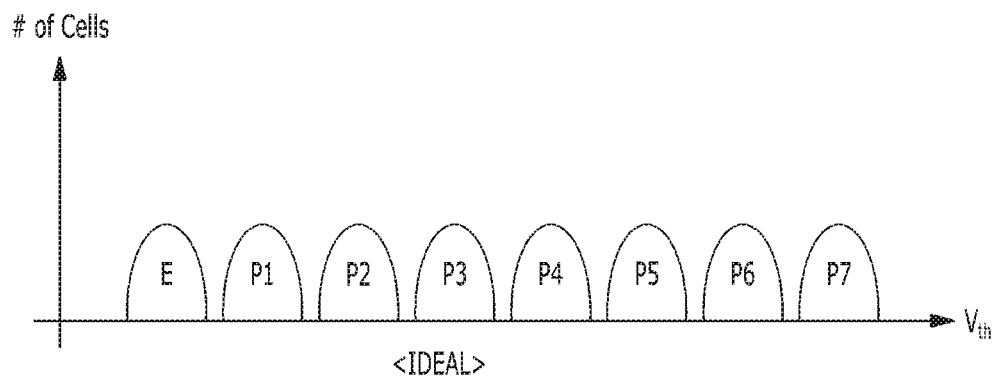
FIG. 1 is a threshold voltage distribution graph illustrating a program state and an erase state of a 3-bit multilevel cell (MLC) nonvolatile memory device.
Figure 2:
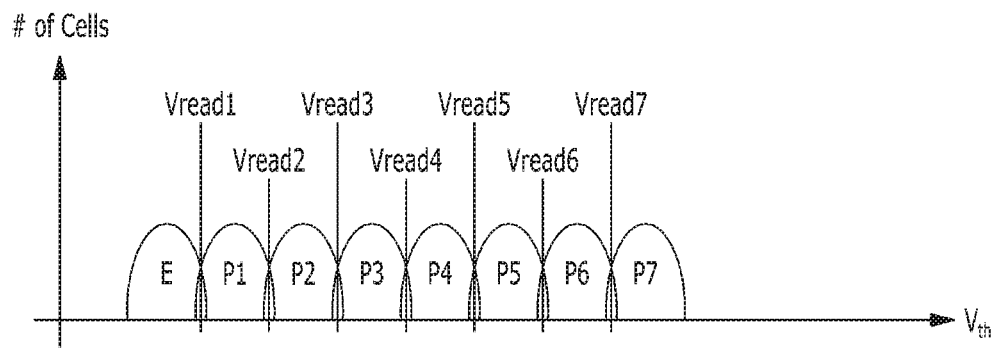
FIG. 2 is a threshold voltage distribution graph illustrating a program state and an erase state that may change due to deterioration in characteristics of the 3-bit multilevel cell nonvolatile memory device.
Figure 3:
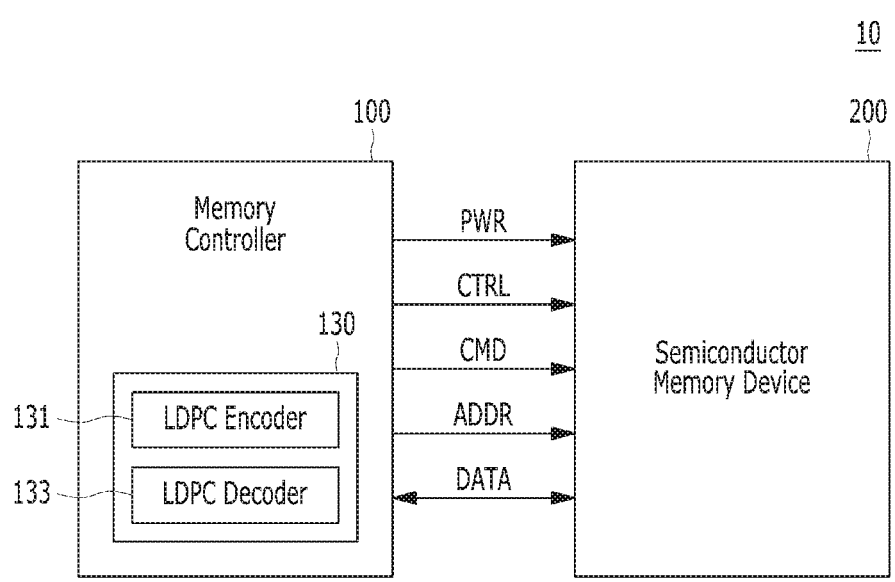
FIG. 3 is a block diagram illustrating a semiconductor memory system in accordance with an embodiment of the present disclosure.
Figure 4B:
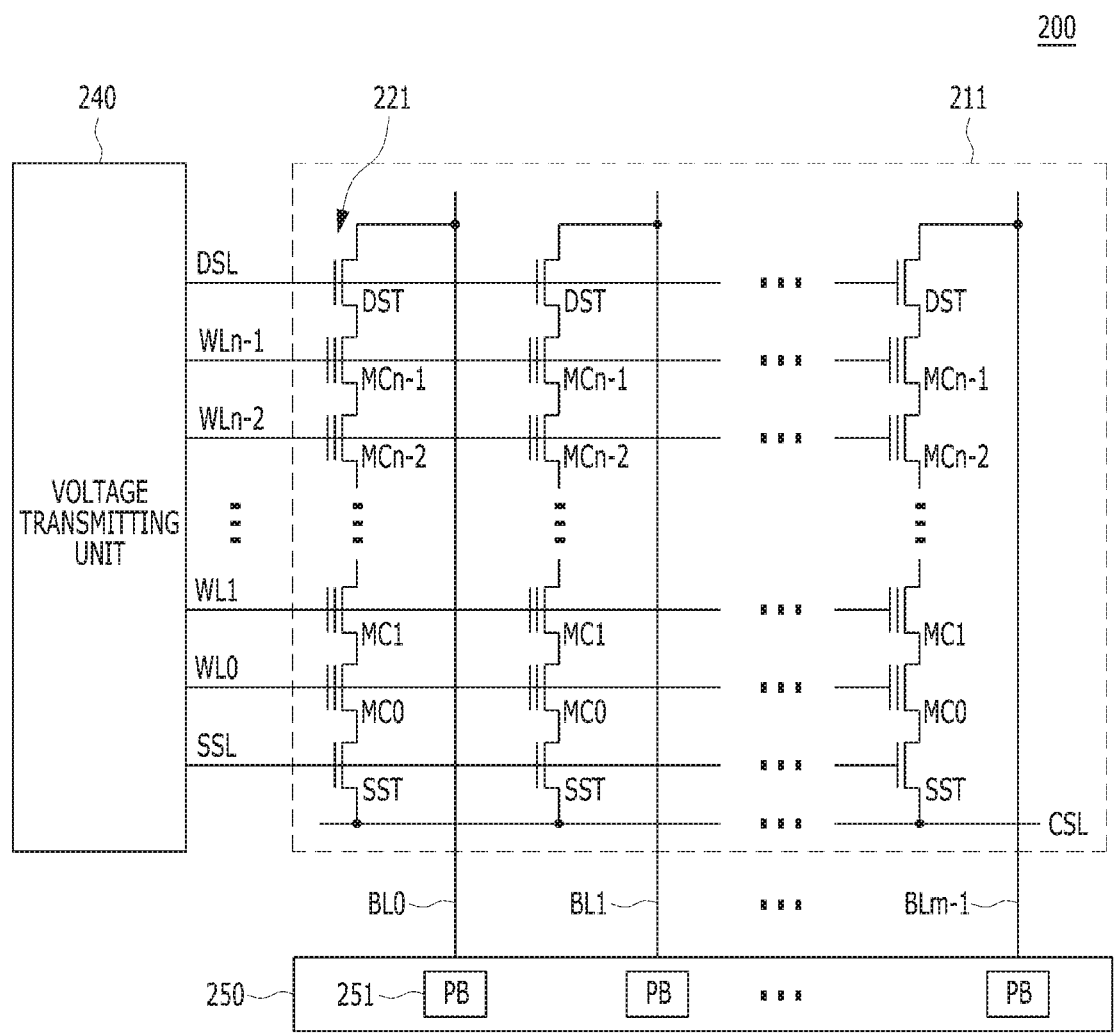
FIG. 4B is a block diagram illustrating a memory block, such as that illustrated in FIG. 4A.
Figure 5:
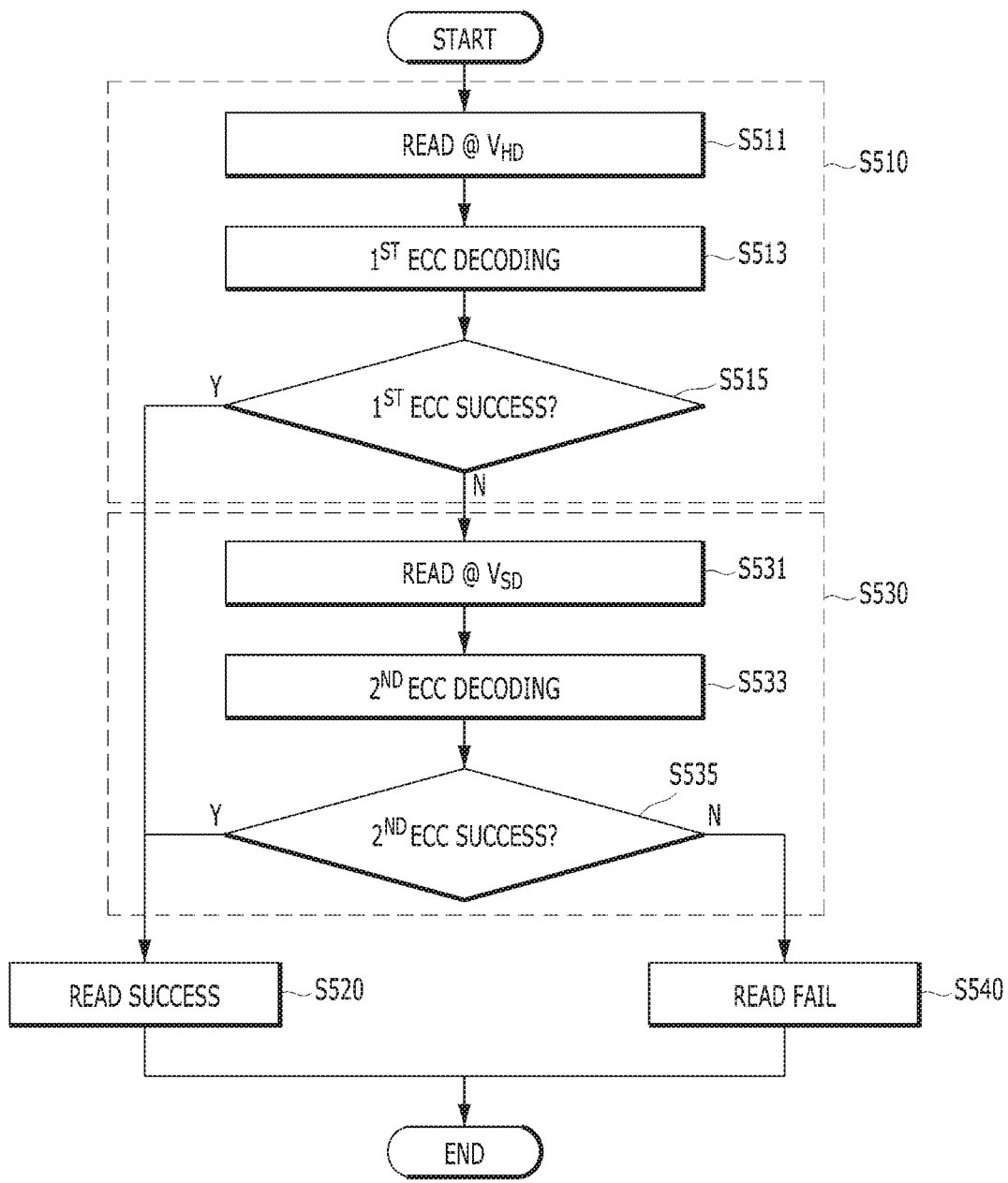
FIG. 5 is a flowchart illustrating an operation of a memory controller, such as that illustrated in FIG. 4A.

Referring now to FIGS. 3 to 5, a semiconductor memory system 10 is provided, according to an embodiment of the present invention. The semiconductor memory system 10 may include a semiconductor memory device 200 operatively coupled to a memory controller 100.

The semiconductor memory device 200 may perform one or more of an erase, a program, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal CTRL may include a command latch enable (CLE) signal, an address latch enable (ALE) signal, a chip enable (CE) signal, a write enable (WE) signal, and a read enable (RE) signal.

The memory controller 100 may control overall operation of the semiconductor memory device 200. The memory controller 100 may include a low density parity check (LDPC) component 130 for correcting error bits. The LDPC component 130 may include an LDPC encoder 131 and an LDPC decoder 133.

The LDPC encoder 131 may perform error correction encoding on data to be programmed into the semiconductor memory device 200, including adding parity bits to the data. The encoded data with the parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds the error correction capacity of the LDPC component 130, the LDPC component 130 may not correct the error bits. In this case, the LDPC component 130 may generate an error correction fail signal.

The LDPC component 130 may correct an error through a low density parity check (LDPC) code. The LDPC component 130 may include any and all circuits, systems, and/or devices for suitable error correction consistent with the teachings herein. The LDPC code may be a binary LDPC code or a non-binary LDPC code.

The LDPC component 130 may perform an error bit correcting operation using hard decision read data and/or soft decision read data. In an embodiment, the LDPC component 130 may perform an error bit correcting operation using soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is an SSD, operation speed of a host (not shown) coupled to the semiconductor memory system 10 may be remarkably improved.

In another embodiment, the memory controller 100 and the semiconductor memory device 200 may be integrated in a single semiconductor device such as a memory card, such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or of a computing system.

Referring to FIG. 4A, the memory controller 100 may include a storage 110, a central processing unit (CPU) 120, the LDPC component 130, a host interface (I/F) 140, a memory interface 150 and a system bus 160.

The storage 110 may operate as a working memory of the CPU 120.

The host interface 140 may communicate with a host through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The LDPC component 130 may detect and correct errors in the data read from the semiconductor memory device 200. The memory interface 150 may interface with the semiconductor memory device 200. The LDPC encoder 131 and the LDPC decoder 133 may be implemented as different and independent components, even though FIG. 4A exemplarily shows the LDPC component 130 including both the LDPC encoder 131 and the LDPC decoder 133. The CPU 120 may perform various control operations.

In an embodiment, during a program operation, the LDPC component 130 may perform an LDPC encoding operation on original data which is to be programmed to the semiconductor memory device 200. During the read operation, the LDPC component 130 may perform an LDPC decoding operation on the LDPC-encoded data or a codeword, which is stored in the semiconductor memory device 200.

Original data is data as received from the host before being encoded by the LDPC component 130 during a program operation. The LDPC-encoded data are stored in the semiconductor memory device 200. The LDPC component 130 may then restore or recover the original data by performing an LDPC decoding operation on the LDPC-encoded data or the codeword stored in the semiconductor memory device 200.

As discussed with reference to FIG. 5, the read operation on the data stored in the semiconductor memory device 200 may include a hard decision read operation (step S511) and a soft decision read operation (step S531). During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, each of which is different than the hard decision read voltage $V_{HD}$. For example, an additional read operation according to the soft decision read voltages $V_{SD}$ may be performed on the memory cell, which has been read according to the hard decision read voltage $V_{HD}$.

The LDPC-encoded data or the codeword, which is stored in the semiconductor memory device 200 and is read through the hard decision read operation, may be decoded back to the original data by the LDPC component 130.

The soft decision read operation includes generating a log likelihood ratio (LLR), which indicates reliability of the hard decision read data, according to the soft decision read voltages $V_{SD}$.

The LDPC component 130 may perform the LDPC decoding operation to generate the LLR. The LDPC component 130 may detect and correct the error of the LDPC-encoded data or the codeword read from the semiconductor memory device 200 through the LLR method.

Referring back to FIG. 4A, the semiconductor memory device 200 may include a memory cell array 210, a control circuit 220, a voltage supply circuit 230, a voltage transmitting circuit 240, a read/write circuit 250, and a column selection circuit 260.

The memory cell array 210 may include a plurality of memory blocks 211. User data may be stored in the memory block 211. The user data may be encoded as described above.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. In an embodiment, each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

By way of example, FIG. 4B illustrates a memory block 211 comprising a NAND-type flash memory cell. However, the memory block 211 is not limited to NAND flash memory. For example, the memory block 211 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operation including program, erase, and read operations, as well as operations related thereto, of the semiconductor memory device 200.

The voltage supply circuit 230 may provide word line voltages (for example, a program voltage, a read voltage, and a pass voltage) to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply circuit 230 may generate a plurality of variable read voltages for generating a plurality of read data.

The voltage transmitting circuit 240 may select one of the memory blocks 211 or sectors of the memory cell array 210, and may select one of the word lines of the selected memory block under the control of the control circuit 220. The voltage transmitting circuit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. During a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. During a verification read operation, the read data may be provided to a pass/fail verification circuit (not illustrated) in the semiconductor memory device 200, which circuit may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated), and may drive the bit lines according to the input data. To this end, as shown in FIG. 4B, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. Target data of the hard and soft decision decoding steps S510 and S530, or the data stored in the semiconductor memory device 200 may be the LDPC-encoded data or the codeword, which is LDPC-encoded by the LDPC component 130.

In an embodiment, the hard decision decoding step S510 may include a hard decision LDPC decoding operation for hard decision read data of fixed length, which is read from a memory cell of the memory block 211 according to the hard decision read voltage $V_{HD}$. The hard decision decoding step S510 may include steps S511 to S515.

In an embodiment, the soft decision decoding step S530 may include a soft decision LDPC decoding operation for the hard decision read data by forming soft decision read data according to soft decision read voltages $V_{SD}$ around the hard decision read voltage $V_{HD}$ when the hard decision LDPC decoding operation finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, a first error correction decoding is performed which may be a hard decision LDPC decoding operation. The LDPC component 130 may perform the hard decision LDPC decoding on the hard decision read data, which is read from the semiconductor memory device 200 according to the hard decision read voltage $V_{HD}$ by using the error correction code.

At step S515, it may be determined whether the first error correction decoding, i.e., the hard decision LDPC decoding operation, succeeded or failed. That is, at step S515, it may be determined whether an error of the hard decision read data, to which the hard decision LDPC decoding operation is performed at step S513, is corrected. For example, the memory controller 100 may determine whether an error of the hard decision read data is corrected by using the hard decision read data and a parity check matrix. When the result of the parity check matrix and the hard decision read data is a zero vector ('0'), it may be determined that the hard decision read data is corrected. On the other hand, when the result of the parity check matrix and the hard decision read data is not the zero vector ('0'), it may be determined that the hard decision read data is not corrected.

When it is determined that the hard decision read data is corrected as the result of the determination of step S515, it may be determined at step S520 that the read operation according to hard decision read voltage $V_{HD}$ at step S511 was successful and the operation of the memory controller 100 may end. The hard decision read data, to which the hard decision LDPC decoding operation is performed at step S513, may be now the error-corrected data and may be provided externally or used in the memory controller 100.

When it is determined that the hard decision read data is not corrected as the result of the determination of step S515, a second error correction decoding may be performed in step S530 which may be a soft decision decoding.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed on the memory cell, to which the hard decision decoding step S510 is performed according to the hard decision read voltage $V_{HD}$. Each of the soft decision read voltages $V_{SD}$ may be different than the hard decision read voltage $V_{HD}$.

At step S533, the soft decision LDPC decoding operation as the second error correction decoding may be performed. The soft decision LDPC decoding operation may be performed based on the soft decision read data comprising the hard decision read data, to which the hard decision LDPC decoding operation is performed, and data read from the memory cell according to the soft decision read voltages $V_{SD}$. The hard decision read voltage $V_{HD}$ may be different than any of the soft decision read voltages $V_{SD}$.

For the semiconductor memory device 200 (i.e., TLC memory device), each of the memory cells MC0 to MCn−1 may belong to one of the threshold voltage distributions including 7 program states P1 to P7 and 1 erase state E.

The hard decision read voltage $V_{HD}$ may have a voltage between 2 neighbouring states of the plurality of states (i.e., E and P1 to P7). Each of the soft decision read voltages $V_{SD}$ may have a voltage between 2 neighbouring states of the plurality of states (i.e., E and P1 to P7), which is different from the hard decision read voltage $V_{HD}$.

The hard decision read data read from the memory cells MC0 to MCn−1 according to the hard decision read voltage $V_{HD}$ and the soft decision read data read therefrom according to the soft decision read voltages $V_{SD}$ may be different. For example, there may be a tailed memory cell among the memory cells MC0 to MCn−1 having a threshold voltage that is higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may be different. When the additional read operation according to the soft decision read voltages $V_{SD}$ is performed as well as the read operation according to the hard decision read voltage $V_{HD}$, additional information on the threshold voltages of the memory cells MC0 to MCn−1 (i.e., additional information on the tailed memory cells) or the log likelihood ratio (LLR) providing reliability of the hard decision read data read by the hard decision read operation may be obtained.

When the additional information is obtained, as indicated by the LLR, the probability of whether the data of the memory cells MC0 to MCn−1 belong to the first state (i.e., '1'), or the second state (i.e., '0'), may increase. That is, the reliability of the LDPC decoding operation may increase. The memory controller 100 may perform the soft decision LDPC decoding operation based on the soft decision read data, which is read according to the hard decision read voltage $V_{HD}$ and the soft decision read voltages $V_{SD}$. The relationship between the hard decision read voltage VHS; and the soft decision read voltages $V_{SD}$ are described with reference to FIGS. 7A and 7B.

At step S535, it may be determined whether the second error decoding, i.e., the soft decision LDPC decoding operation, succeeded or failed. That is, at step S535, it may determined whether an error of the soft decision read data, to which the soft decision LDPC decoding operation is performed at step S533, is corrected. For example, the memory controller 100 may determine whether an error of the soft decision read data is corrected by using the soft decision read data and the parity check matrix. For example, when the result of the parity check matrix and the soft decision read data is a zero vector ('0'), it may be determined that the soft decision read data, to which the soft decision LDPC decoding operation is performed, is corrected. On the other hand, when the result of the parity check matrix and the soft decision read data is not a zero vector ('0'), it may be determined that the soft decision read data, to which the soft decision LDPC decoding operation is performed, is not corrected.

The multiplication of the parity check matrix and the hard decision read data during the hard decision decoding step S510 may be the same as the multiplication of the parity check matrix and the soft decision read data during the soft decision decoding step S530. The multiplication may be the matrix product.

When it is determined that the soft decision read data is corrected as the result of determination of step S535, it may be determined at step S520 that the read operation according to soft decision read voltage $V_{SD}$ at step S531 was successful and the operation of the memory controller 100 may end. The soft decision read data, to which the soft decision LDPC decoding operation is performed at step S533, may be now the error-corrected data and may be provided externally or used in the memory controller 100.

When it is determined that the soft decision read data is not corrected as the result of determination of step S535, it may be determined at step S540 that the read operation on the memory cells MC0 to MCn−1 finally failed and the memory controller 100 may end the read operation.

Figure 6A:
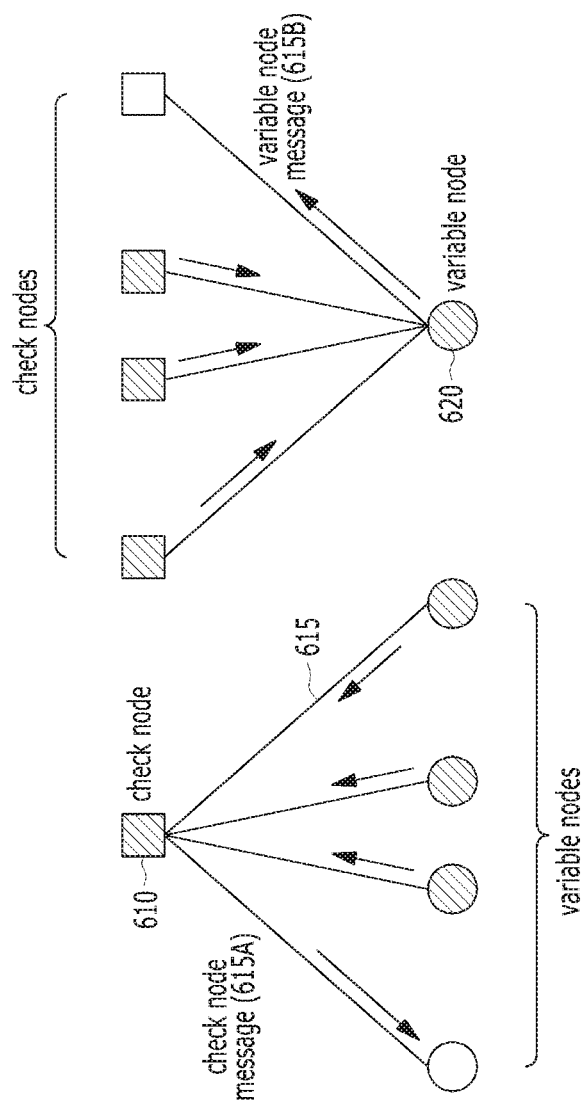
FIG. 6A is a diagram illustrating LDPC decoding represented by a Tanner graph.

FIG. 6A is a schematic diagram illustrating an LDPC decoding operation using a Tanner graph.

Figure 6B:
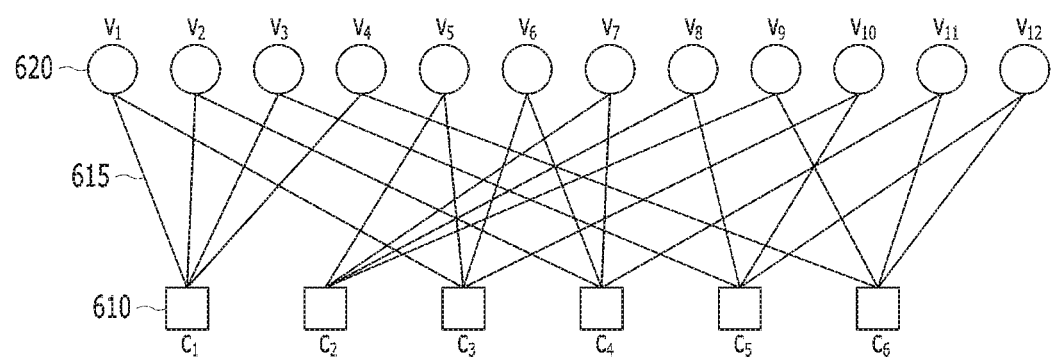
FIG. 6B is a diagram illustrating an LDPC code structure.

FIG. 6B is a schematic diagram illustrating an LDPC code.

FIG. 6C is a schematic diagram illustrating a syndrome check process according to the LDPC decoding operation.

An error correction code (ECC) is commonly used in storage devices (or memory systems). Various physical phenomena occurring in storage devices result in noise effects that corrupt information stored therein. Error correction coding methods may be used for protecting the stored information against such errors. This is done by encoding the information before storing the information in the memory device. The encoding process transforms the information (bit sequence) into a codeword by adding redundancy to the information. This redundancy can then be used in order to recover the information from the possibly corrupted codeword through a decoding process.

In iterative coding methods, the code is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, decoding can be viewed as iterative message passing over the graph edges.

The iterative codes may include the LDPC code. The LDPC code is a linear binary block code defined by a sparse parity-check matrix H.

Referring to FIG. 6A, the LDPC code has a parity check matrix in which the number of 1's in each row and column is very small, and its structure can be defined by the Tanner graph including check nodes 610, variable nodes 620, and edges 615 connecting the check nodes 610 to the variable nodes 620. A value delivered from the check node 610 to the variable node 620 after check node processing represents a check node message 615A. A value delivered from the variable node 620 to the check node 610 after variable node processing represents a variable node message 615B.

A decoding process of the LDPC code may be performed by iterative decoding based on a 'sum-product' algorithm. A decoding method can be provided based on a suboptimal message-passing algorithm such as a 'min-sum' algorithm, which is a simplified version of the sum-product algorithm.

Referring to FIG. 6B, the Tanner graph of the LDPC code includes 6 check nodes 610 representing parity check equations of the LDPC code, 12 variable nodes 620 representing code symbols, and edges 615 representing relationships between the check nodes 610 and the variable nodes 620. Each edge 615 connects a check node 610 to a variable node 620 corresponding to a code symbol in the parity check equations represented by the check node 610. By way of example, FIG. 6B illustrates a regular LDPC code in which the number of variable nodes 620 coupled to each of the check nodes 610 is fixed at 4 and the number of the check nodes 610 coupled to each of the variable nodes 620 is fixed at 2. An initial value of a variable node 620 may be one of the hard decision read data and the soft decision read data.

FIG. 6C shows a parity check matrix H corresponding to the Tanner graph. The parity check matrix H represents the graphic expression of the parity check equations. The parity check matrix H has the same number of 1's in each column and the same number of 1's in each row, although the number of 1's in a column is not necessarily the same as the number of 1's in a row. That is, the parity check matrix H of FIG. 6C represents the Tanner graph of FIG. 6B. In the illustrated embodiment, the graph consists of 6 rows representing the number of check nodes and 12 columns representing the number of variable nodes. Check node $v_i$ is connected to variable node $c_j$ if the element $h_{ij}$ of H is 1, as is known in the art.

A process of decoding the LDPC code is performed by iterating a process of exchanging messages, which are generated and updated in each node, between the variable nodes 620 and the check nodes 610 in the Tanner graph. In this case, each node updates the messages based on the sum-product algorithm or a similar suboptimal algorithm.

For example, the LDPC decoding operation on the hard decision read data may comprise a plurality of iterations, each of which includes update of the check nodes 610 after an initial update of the variable nodes 620, update of the variable nodes 620, and a syndrome check. After the single iteration, when the result of the syndrome check satisfies a condition, the LDPC decoding operation may end. When the result of the syndrome check does not satisfy the condition, which may be set or determined in advance, an additional iteration may be performed. The additional iteration may include the variable node update, the check node update and the syndrome check. The number of iterations may be limited to a maximum number of iterations. When the result of the syndrome check still does not satisfy the condition after performing the maximum number of iterations, the LDPC decoding operation may be determined to have failed.

Referring to FIG. 6C, the syndrome check is a process of identifying whether the product result "$H\underline{v}^T$" of the parity check matrix H and a vector "v", which is obtained by the update of the variable nodes 620, satisfies the condition. When the product result "$H\underline{v}^T$" becomes the zero vector, the product result "$H\underline{v}^T$" may be deemed to satisfy the condition.

By way of example, FIG. 6C shows a non-zero vector "001010" as the product result "$H\underline{v}^T$", which shows that the syndrome check does not satisfy the condition and thus another iteration should be performed according to another hard decision read voltage $V_{HD}$.

Considering the non-zero vector "001010" as the product result "$H\underline{v}^T$", the number of non-zero vector elements (or elements) that do not meet the zero vector condition, is 2. In the description, each element that does not meet the zero vector condition of the syndrome check for the product result "$H\underline{v}^T$" in an iteration is defined as an unsatisfied syndrome check (USC). By way of example, FIG. 6C shows the result of the syndrome check where the number of the USC is 2.

Figure 7A:
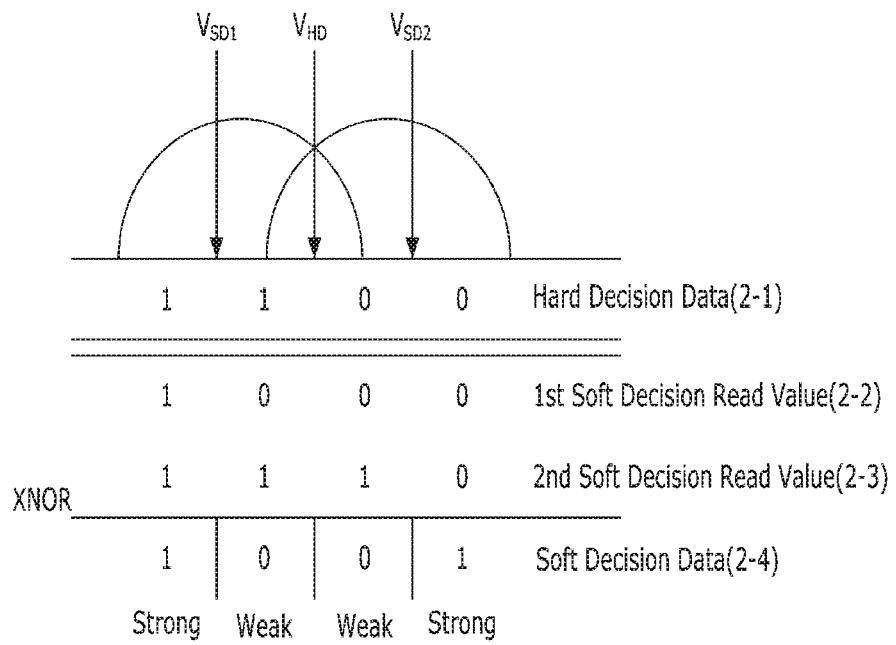
FIG. 7A is a diagram illustrating a 2-bit soft decision read operation as an example of the soft decision read operation illustrated in FIG. 5.
Figure 7B:
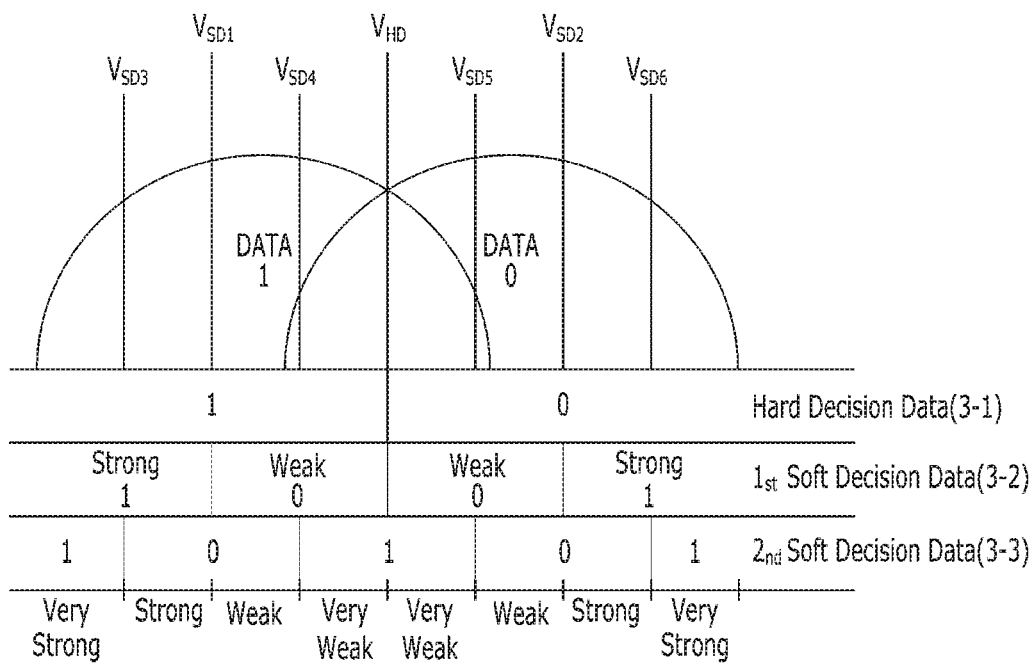

FIGS. 7A and 7B are schematic diagrams illustrating the soft decision read operation shown in FIG. 5, particularly 2-bit and 3-bit soft decision read operations, respectively.

Referring to FIG. 7A, during the hard decision decoding operation of step S510 shown in FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, each of which is different than the hard decision read voltage $V_{HD}$, are applied to the memory cell.

During the 2-bit soft decision read operation, a first soft decision read value 2-2 may be '1000' according to the on/off state of a memory cell when the first soft decision read voltage $V_{SD1}$ is applied to the memory cell. In a similar way, a second soft decision read value 2-3 may be '1110' according to the on/off state of the memory cell when the second soft decision read voltages $V_{SD2}$ is applied to the memory cell.

In an embodiment, the LDPC component 130 may generate a soft decision read data 2-4 or the LLR through the XNOR operation on the first and second soft decision read values 2-2 and 2-3. The LLR 2-4 may indicate reliability of the hard decision read data 2-1.

For example, the value '1' of the soft decision read data 2-4 may show a "strong" probability that the first and second statuses (the logic values of '1' and '0') of the hard decision read data 2-1 are correct. On the other hand, the value '0' of the soft decision read data 2-4 may show a "weak" probability that the first and second statuses of the hard decision read data 2-1 are correct.

Referring to FIG. 7B, during the hard decision decoding operation of step S510 of FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, each of which is different than the hard decision read voltage $V_{HD}$, are applied to the memory cell.

Referring to FIG. 7B, during the 3-bit soft decision read operation, first and second soft decision read values may be generated according to the on/off state of a memory cell when first and second soft decision read voltages $V_{SD1}$ and $V_{SD2}$ are applied to the memory cell, which is similar to the 2-bit soft decision read operation of FIG. 7A. The LDPC component 130 may generate a first soft decision read data 3-2 '1001' or the LLR through an XNOR operation on the first and second soft decision read values.

In a similar way, during the 3-bit soft decision read operation, third to sixth soft decision read values may be generated according to the on/off state of the memory cell when third to sixth soft decision read voltages $V_{SD3}$ to $V_{SD6}$, different from the first and second soft decision read voltages $V_{SD1}$ and $V_{SD2}$, are applied to the memory cell, which is similar to the 2-bit soft decision read operation of FIG. 7A.

The LDPC component 130 may generate a second soft decision read data 3-3 ('10101') or the LLR through the XNOR operation on the third to sixth soft decision read values. The LLR 3-3 ('10101') may provide a weighted value to the first soft decision read data 3-2.

For example, the value '1' of the second soft decision read data 3-3 may show a "very strong" probability that the first state (the logic value of '1') of the first soft decision read data 3-2 is correct. On the other hand, the value '0' of the second soft decision read data 3-3 may show a "strong" probability that the first state of the first soft decision read data 3-2 is correct.

In a similar way, the value '1' of the second soft decision read data 3-3 may show a "very weak" probability that the second state (i.e., the logic value of '0') of the first soft decision read data 3-2 is correct. On the other hand, the value '0' of the second soft decision read data 3-3 may show a "weak" probability that the second state of the first soft decision read data 3-2 is correct. The LLR 3-3 may provide a better reliability as to the hard decision read data 3-1, which is similar to the 2-bit soft decision read operation of FIG. 7A.

The LLR may be expressed by $$LLR = \log\frac{p_0}{p_1}.$$

$P_0$ denotes the probability that the value of corresponding hard decision data is '0' and $P_1$ denotes the probability that the value of the corresponding hard decision data is '1'. The greater the probability that the value of the hard decision data is '0', the more positive the LLR value is, and the greater the probability that the value thereof is '1', the greater more negative the LLR value is. When the probability that the value is '0' and the probability that the value is '1' are very weak, the LLR value may have a value close to "0". That is, the greater the absolute value of the LLR value, the higher the reliability of the data value, and the smaller the absolute value thereof, the lower the reliability of the data value.

Figure 8:
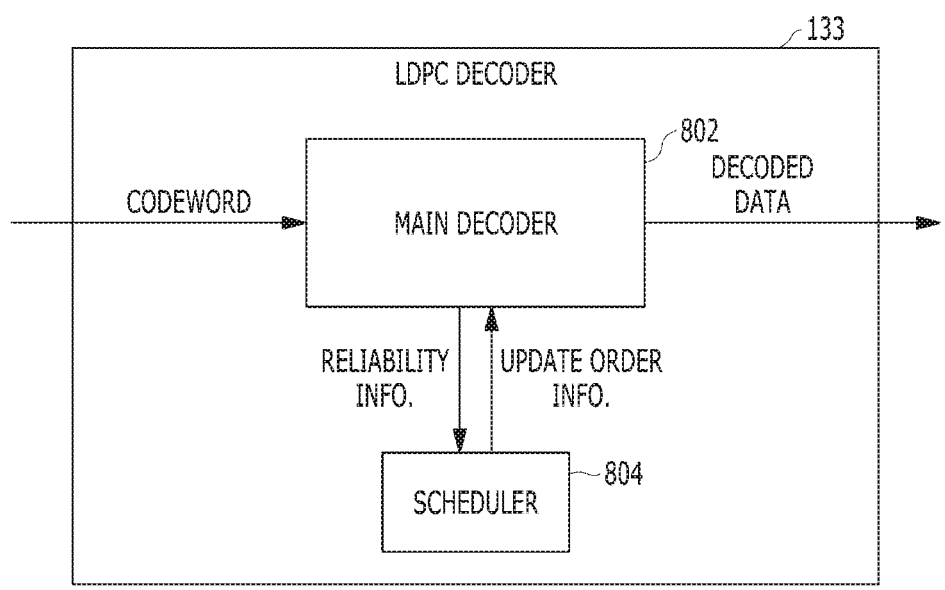
FIG. 8 is a block diagram illustrating an LDPC decoder in accordance with an embodiment of the present disclosure.

FIG. 8 is a block diagram lustrating the LDPC decoder 133 in accordance with an embodiment of the present disclosure.

Referring to FIG. 8, the LDPC decoder 133 may include a main decoder 802 and a scheduler 804.

The main decoder 802 may receive codewords read from the semiconductor memory device 200 and perform one or more iterations, each iteration including a node update and a syndrome check with respect to the codewords until decoding is successful.

The main decoder 802 may perform initial update that sets the value of each variable node to the value of each symbol of the codeword. The main decoder 802 may update check nodes based on the updated values of the variable nodes and update the variable nodes based on the updated values of the check nodes. The main decoder 802 may perform syndrome check through an operation of the updated values of the variable nodes and a parity check matrix. When there is no USC as the syndrome check result, the main decoder 802 may output decoded data, that is, original data that has been successfully recovered.

The codeword read from the semiconductor memory device 200 may include one or more errors. The main decoder 802 needs to refer to the values of the check nodes and the values of other variable nodes in order to update the variable nodes. In the illustrated example of FIG. 6B, in order to update a first variable node $v_1$, the main decoder 802 needs to refer to the values of first and third check nodes $c_1$ and $c_3$ connected to the first variable node $v_1$. The value of the first check node $c_1$ may depend on the values of second to fourth variable nodes $v_2$ to $v_4$ connected to the first check node $c_1$ and the value of the third check node $c_3$ may depend on the values of fifth, sixth, and tenth variable nodes $v_5$, $v_6$, and $v_{10}$ connected to the third check node $c_3$.

When the main decoder 802 updates other variable nodes based on the value of a variable node with high reliability, there is a high probability that the updated values of the variable nodes converge to the value of the original data. However, when the main decoder 802 updates other variable nodes based on the value of a variable node with low reliability, the updated values of the variable nodes may not converge to the value of the original data. When the values of the variable nodes do not converge to the value of the original data, the overall convergence speed of the LDPC decoding may be slowed down.

If the main decoder 802 may first update a variable node with low reliability to increase the reliability of the variable node and then utilize the variable node with the increased reliability when updating other variable nodes, the convergence speed of the LDPC decoding may be improved.

In accordance with an embodiment of the present disclosure, the scheduler 804 may group a plurality of variable nodes into a plurality of variable node groups and determine an order in which the variable node groups are updated such that a variable node group with low reliability is first updated. The scheduler 804 may acquire reliability information (RELIABILITY INFO.) of each variable node from the main decoder 802.

The main decoder 802 may repeat an operation of updating check nodes associated with a variable node group with a high priority according to the update order (UPDATE ORDE INFO.) acquired from the scheduler 804 and updating the variable node group with a high priority based on the updated check nodes, until all the variable node groups are updated.

The main decoder 802 may perform syndrome check of variable nodes updated as the node update result. Further, the main decoder 802 may output decoded data or perform next iteration according to the syndrome check result.

The values of variable nodes of a variable node group with low reliability may be first updated and then used for updating other variable node groups. It is possible to substantially prevent the variable node with low reliability from directly affecting other variable nodes when updating the other variable nodes. Accordingly, the LDPC decoder 133 in accordance with an embodiment of the present disclosure may speed up the convergence speed of the LDPC decoding.

Hereinafter, an operating method of the LDPC decoder 133 in accordance with an embodiment of the present disclosure is described in detail with reference to FIG. 9, FIG. 10A, and FIG. 10B.

Figure 9:
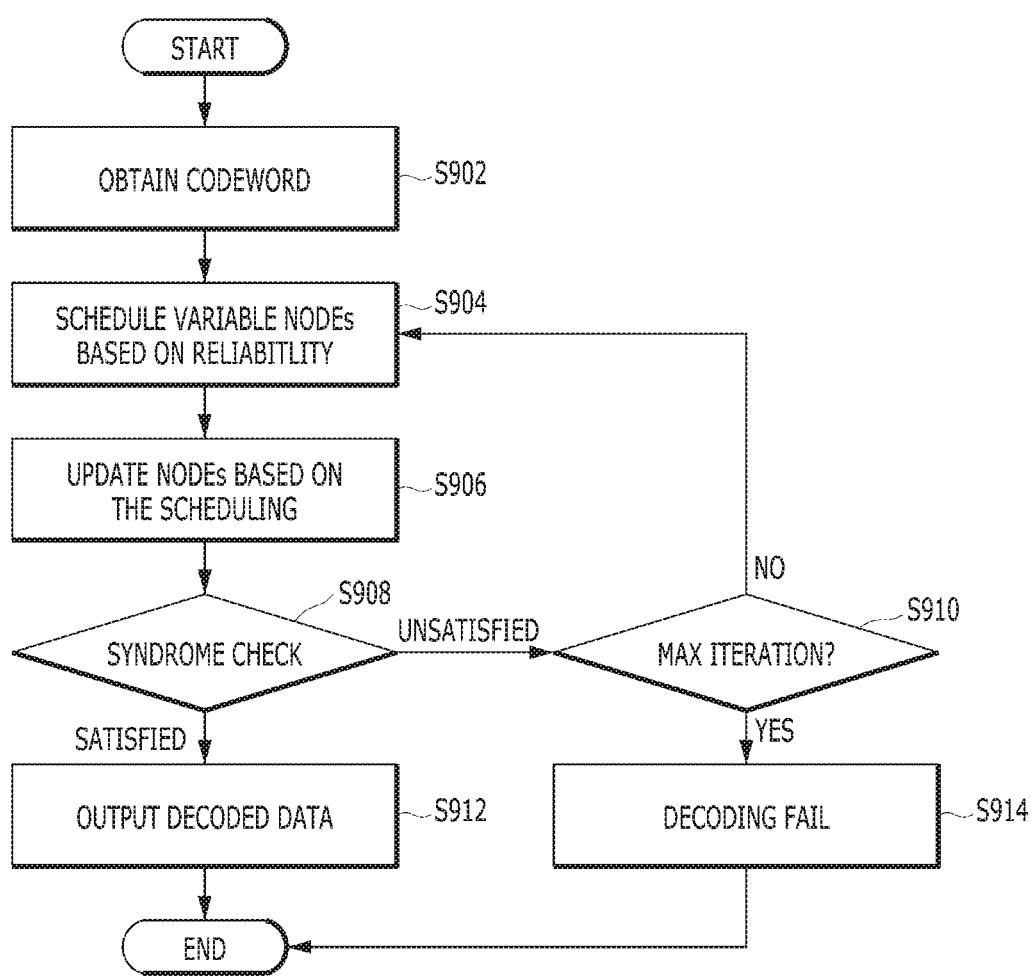
FIG. 9 is a flowchart illustrating an operation of an LDPC decoder, such as that illustrated in FIG. 8, in accordance with an embodiment of the present disclosure.

FIG. 9 is a flowchart illustrating operation of the LDPC decoder 133 in accordance with an embodiment of the present disclosure.

Referring to FIG. 9, in step S902, the main decoder 802 may obtain codewords read from the semiconductor memory device 200. Then, the main decoder 802 may perform initial update that sets the value of each variable node to the corresponding symbol of the codeword.

The LDPC decoder 133 may perform hard decision decoding or soft decision decoding. When the LDPC decoder 133 performs the soft decision decoding, the main decoder 802 may further obtain an LLR according to the soft decision read operation result of the memory controller 100.

In step S904, the scheduler 804 may schedule an order in which variable nodes are updated based on the reliability of each of the variable nodes. The scheduler 804 may provide the scheduled update order to the main decoder 802.

In an embodiment, the scheduler 804 may acquire the LLR from the main decoder 802 and determine the reliability of each variable node based on the LLR. As described with reference to FIG. 7B, the greater the absolute value of the LLR value, the higher the reliability of a corresponding variable node, whereas the smaller the absolute value thereof, the lower the reliability of the corresponding variable node. The scheduler 804 may schedule the update order of the variable nodes such that a variable node with low reliability is first updated.

In a first example, the scheduler 804 may generate a plurality of variable node groups by grouping a plurality of variable nodes, which have been sorted in the order of the codewords, into a set number of groups. The scheduler 804 may determine the reliability of each of the variable node groups. For example, the reliability of each variable node group may be determined as the sum of the LLR values of variable nodes belonging to that variable node group. The scheduler 804 may determine an update order of the variable node groups such that a variable node group with low reliability is first updated.

In a second example, the scheduler 804 may generate a plurality of variable node groups by sorting variable nodes in descending order of the LLR values of the variable nodes and grouping the sorted variable nodes into a set number of groups. The scheduler 804 may determine an update order of the variable node groups such that a variable node group with low reliability is first updated.

In the first and second examples, the number of variable nodes in one variable node group may be determined based on the number of variable nodes that may be updated by the main decoder 802 at one time. For example, when node update to be described below may be performed on maximum 64 variable nodes at one time, the number of variable nodes in a variable node group may be up to 64 according to the performance of the main decoder 802.

In step S906, the main decoder 802 may perform node update based on the scheduled update order.

The main decoder 802 may repeat an operation of updating check nodes associated with a variable node group with a high priority according to the update order among variable node groups not yet updated in step S906 and updating the variable node group with a high priority based on the updated check nodes until all the variable node groups are updated.

The main decoder 802 may first update a high-priority variable node group with low reliability and may then update a variable node group with a low priority. The operation of updating the variable node group with a low priority is not directly affected by variable values of the high-priority variable node group with low reliability. Accordingly, the convergence speed of the LDPC decoding may be improved.

In step S908, the main decoder 802 may perform syndrome check based on the updated variable nodes and the parity check matrix. An example of the syndrome check is described above with reference to FIG. 6A.

As the syndrome check result, when all the check nodes satisfy the zero vector condition ("SATISFIED" in step S908), the main decoder 802 may output the decoded data in step S912. The decoded data may be outputted from the memory controller 100 to another device/component or may be used inside the memory controller 100.

As the syndrome check result, when any one of the check nodes does not satisfy the zero vector condition ("UNSATISFIED" in step S908), the main decoder 802 may determine in step S910 whether the LDPC decoding has reached the maximum number of iterations.

When the LDPC decoding has reached the maximum number of iterations ("YES" in step S910), the main decoder 802 may determine in step S914 that the LDPC decoding is a failure and end the LDPC decoding.

When the LDPC decoding has not reached the maximum number of iterations ("NO" in step S910), the main decoder 802 may repeat steps S904, S906, and S908.

The scheduler 804 may determine the reliability of each variable node based on the syndrome check operation result after the second iteration in which the syndrome check operation result may be acquired from the main decoder 802. An example of an operation in which the scheduler 804 schedules the update order of the variable nodes according to the syndrome check operation result and the main decoder 802 performs the node update according to the scheduling is described with reference to FIG. 10A and FIG. 10B.

Figure 10A:
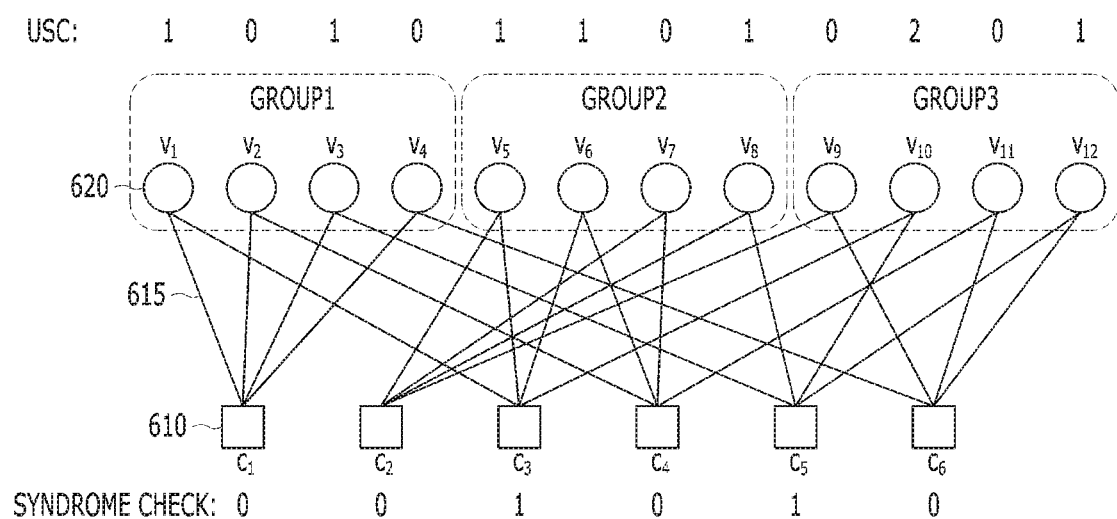
FIG. 10A and FIG. 10B are Tanner graphs for explaining the operation of an LDPC decoder in accordance with an embodiment of the present disclosure.
Figure 10B:
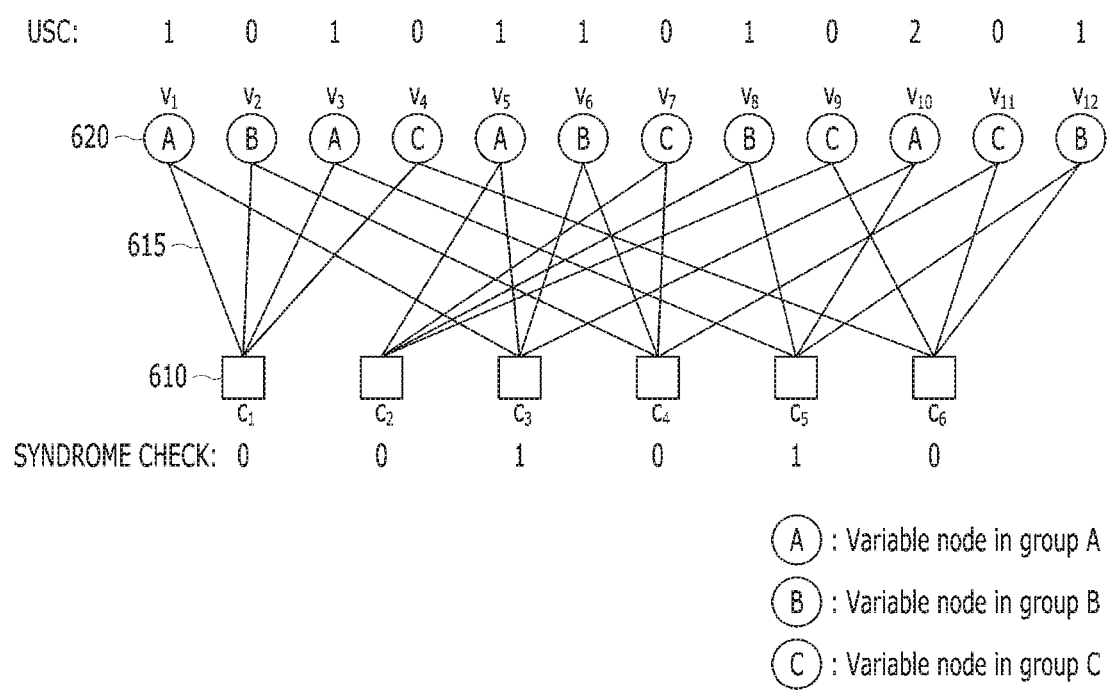

FIG. 10A and FIG. 10B are Tanner graphs illustrating the operation of the LDPC decoder 133 in accordance with an embodiment of the present disclosure.

FIG. 10A is a diagram illustrating a first example of a method in which the scheduler 804 determines an update order of variable nodes based on a syndrome check operation result.

The scheduler 804 may generate variable node groups by grouping variable nodes, which have been sorted in codeword order, into a set number of groups. By way of example, FIG. 10A illustrates first to third groups GROUP1 to GROUP3 obtained by grouping 12 variable nodes by 4 in codeword order.

The scheduler 804 may acquire a syndrome check operation result of previous iteration from the main decoder 802. FIG. 10A illustrates the acquired syndrome check operation result SYNDROME CHECK.

The scheduler 804 may determine the reliability of each variable node based on the number of USCs connected to that variable node. The scheduler 804 may determine that the greater the number of USCs connected to a variable node, the lower the reliability of the variable node.

The scheduler 804 may determine the number of USCs connected to each variable node. For example, since the first variable node $v_1$ is connected to the first check node $c_1$, which is not a USC, and the third check node $c_3$, which is a USC, the number of USCs connected to the first variable node $v_1$ is '1'. FIG. 10A illustrates the number of USCs connected to each of first to twelfth variable nodes.

The scheduler 804 may determine the reliability of each variable node group based on the number of USCs connected to each variable node in that group. For example, the scheduler 804 may determine that the greater the sum of the numbers of USCs of respective variable nodes belonging to a variable node group, the lower the reliability of that variable node group. In FIG. 10A, the sum of the USCs of a first group GROUP1 is '2' and the sum of the USCs of each of the second and third groups GROUP2, GROUP3 is '3'. The scheduler 804 may determine that the reliability of each of the second and third groups GROUP2, GROUP3 is lower than that of the first group GROUP1. The scheduler 804 may determine an update order of the variable node groups such that a variable node group having the large sum of USCs is first updated. In the example of FIG. 10A, the scheduler 804 may determine an update order such that the second or third group GROUP2, GROUP3 is updated first and the first group GROUP1 is updated last. The main decoder 802 may perform variable node update based on the determined update order.

An example in which node update is performed on the third group first is described.

The main decoder 802 may update check nodes associated with the third group GROUP3. The main decoder 802 may determine check nodes, which are connected to each of the ninth to twelfth variable nodes $v_9$ to $v_{12}$ belonging to the third group GROUP3, as the check nodes associated with the third group GROUP3. In the example of FIG. 10A, the check nodes associated with the third variable node group GROUP3 are second to sixth check nodes $c_2$ to $c_6$.

The main decoder 802 may update the second to sixth check nodes $c_2$ to $c_6$ based on the first to twelfth variable nodes $v_1$ to $v_{12}$. The main decoder 802 may update the third variable node group GROUP3 based on the updated second to sixth check nodes $c_2$ to $c_6$.

After the third group GROUP3 is updated, the second group GROUP2 may be updated. In the example of FIG. 10A, check nodes associated with the second group GROUP2 are the second to fifth check nodes $c_2$ to $c_5$.

The main decoder 802 may update the second to fifth check nodes $c_2$ to $c_5$ based on the first to twelfth variable nodes $v_1$ to $v_{12}$, and update the second group GROUP2 based on the updated second to fifth check nodes $c_2$ to $c_5$.

When updating the second to fifth check nodes $c_2$ to $c_5$, the ninth to twelfth variable nodes $v_9$ to $v_{12}$ have already been updated due to the update of the third group GROUP3. Although the third group GROUP3 has been determined as a variable node group with low reliability, reliability of the third group GROUP3 may be improved because the third group GROUP3 has been updated based on a plurality of variable nodes and check nodes. When updating the second group GROUP2, the main decoder 802 uses variable node values with improved reliability instead of the variable node values of the third group GROUP3 with low reliability, so that the convergence speed of the LDPC decoding may be improved.

FIG. 10B is a diagram illustrating a second example of the method in which the scheduler 804 determines an update order of variable nodes based on a syndrome check operation result.

Similar to FIG. 10A, FIG. 10B illustrates a Tanner graph, a syndrome check operation result SYNDROME CHECK of previous iteration, and the number of USCs connected to each variable node.

The scheduler 804 may generate variable node groups by sorting variable nodes in ascending order of the number of USCs connected to each variable node and grouping the sorted variable nodes into a set number of groups.

In the example of FIG. 10B, the number of USCs connected to the tenth variable node $v_{10}$ is '2', the number of USCs connected to each of the first, third, fifth, sixth, eighth, and twelfth variable nodes $v_1$, $v_3$, $v_5$, $v_6$, $v_8$, and $v_{12}$ is '1', and the number of USCs connected to each of the second, fourth, seventh, ninth, and eleventh variable nodes $v_2$, $v_4$, $v_7$, $v_9$, and $v_{11}$ is '0'.

FIG. 10B illustrates a case where a set number of variable nodes are grouped in ascending order of the number of USCs. Among the 12 variable nodes, scheduler 804 may group into a group A the first, third, and fifth variable nodes $v_1$, $v_3$, and $v_5$, each of which has a USC number of '1', and the tenth variable node $v_{10}$, with a USC number of '2'. The scheduler 804 may group into a group B the sixth, eighth, and twelfth variable nodes $v_6$, $v_8$, and $v_{12}$, each of which has a USC number of '1', and the second variable node $v_2$ with a USC number of '0'. The scheduler 804 may group the remaining variable nodes ($v_4$, $v_7$, $v_9$ and $v_{11}$), each with a USC number of '0' into a group C. FIG. 10B illustrates the variable node groups to which the variable nodes belong, respectively.

The scheduler 804 may determine an update order of the variable node groups such that the variable nodes are first updated in the order of the group A, the group B, and the group C. The main decoder 802 may perform variable node update based on the determined update order.

In accordance with an embodiment of the present disclosure, the LDPC decoder 133 may schedule an order in which variable nodes are updated such that variable nodes with low reliability among a plurality of variable nodes are first updated. The LDPC decoder 133 may determine the reliability based on the LLR for each variable node acquired from the soft read operation or the number of USCs for each variable node acquired from the syndrome check operation result of previous iteration. The LDPC decoder 133 may first update a variable node with low reliability, thereby substantially preventing the variable node with low reliability from directly affecting other variable nodes when updating the other variable nodes. The memory controller 100 including the LDPC decoder 133 in accordance with an embodiment of the present disclosure may reduce error propagation and decrease the time to obtain convergence in the LDPC decoding, so that it is possible to more quickly and accurately read data stored in the semiconductor memory device 200.

Although various embodiments are illustrated and described, various modifications can be made without departing from the scope of the present invention, as those skilled in the art will recognize. Accordingly, the scope of the present invention is not limited to the disclosed embodiments. Rather, the present invention encompasses all modifications and variations that fall within the scope of the claims and their equivalents.

What is claimed is:

1. An operating method of a low density parity check (LDPC) decoder, the operating method comprising:
   initially updating codewords to variable nodes;
   determining an update order in which a plurality of variable node groups are updated, which is determined based on reliability of each of the variable node groups;
   executing local iterations including update of check nodes associated with a select variable node group among the variable node groups and update of the select variable node group based on the updated check nodes, until all the variable node groups are updated based on the update order;
   performing syndrome check to determine whether LDPC decoding is successful, based on an operation of the updated variable nodes and a parity check matrix; and wherein each cycle of the determining of the update order, the executing local iterations and the performing of the syndrome check represents a global iteration, which is repeated until the decoding is successful or the number of global iterations performed reaches a maximum number.

2. The operating method of claim 1, wherein the determining of the update order comprises:
each of the variable node groups based on a log likelihood ratio (LLR) value of each variable node of the corresponding variable node group.

3. The operating method of claim 2, wherein the determining of the reliability of each of the variable node groups comprises:
for each variable node group, summing the LLR values of the variable nodes belonging to that variable node group.

4. The operating method of claim 1, wherein the determining of the update order comprises:
determining reliability of each of the variable node groups based on the number of unsatisfied check nodes (USCs) connected to each variable node of the corresponding variable node group,
wherein the USC is determined in the syndrome check of a previous global iteration.

5. The operating method of claim 4, wherein the determining the reliability of each of the variable node groups comprises:
assigning higher reliability to a variable node having a lower number of connected USCs than a variable node having a higher number of connected USCs; and
determining the reliability of each of the variable node groups as a sum of reliabilities of the variable nodes belonging to the respective variable node groups.

6. The operating method of claim 1, wherein the determining of the update order comprises:
generating the plurality of variable node groups by grouping the plurality of variable nodes sorted in descending order of reliability into a set number of groups; and
determining the update order such that a variable node group with lower reliability among the plurality of variable node groups is updated before a variable node group with higher reliability.

7. The operating method of claim 1, wherein the determining of the update order comprises:
generating the plurality of variable node groups by grouping the plurality of variable nodes, which have been sorted in an order of the codewords, into a set number of groups; and
determining the update order such that a variable node group with lower reliability among the plurality of variable node groups is updated before a variable node group with higher reliability.

8. A low density parity check (LDDC) decoder comprising:
a main decoder configured to initially update codewords to variable nodes; and
a scheduler configured to determine an update order in which a plurality of variable node groups are updated, which is determined based on reliability of each of the variable node groups,
wherein the main decoder executes local iterations including update of check nodes associated with a select variable node group among the variable node groups and update of the select variable node group based on the updated check nodes, until all the variable node groups are updated based on the update order, and performs syndrome check to determine whether LDPC decoding is successful, based on an operation of the updated variable nodes and a parity check matrix, and
wherein each cycle of the determining of the update order, the executing of the local iterations, and the performing of the syndrome check represents a global iteration, which the LDPC decoder repeats until the decoding is successful or the number of global iterations performed reaches a maximum number.

9. The LDPC decoder of claim 8, wherein the scheduler determines reliability of each of the variable node groups based on a log likelihood ratio (LLR) value of each variable node of the corresponding variable node group.

10. The LDPC decoder of claim 9, wherein the scheduler determines the reliability of each the variable node group as a sum of LLR values of variable nodes belonging to the corresponding variable node group.

11. The LDPC decoder of claim 8, wherein the scheduler determines reliability of each of the variable node groups based on the number of unsatisfied check nodes (USCs) connected to each variable node of the corresponding variable node group, and
the USC is determined in the syndrome check of a previous global iteration.

12. The LDPC decoder of claim 11, wherein the scheduler assigns higher reliability to a variable node having a lower number of connected USCs than a variable node having a higher number of connected USCs, and determines the reliability of each of the variable node groups as a sum of reliabilities of the variable nodes belonging to the respective variable node groups.

13. The LDPC decoder of claim 8, wherein the scheduler generates the plurality of variable node groups by grouping the plurality of variable nodes, which have been sorted in descending order of reliability, into a set number of groups, and determines the update order such that a variable node group with lower reliability among the plurality of variable node groups is updated before a variable node group with higher reliability.

14. The LDPC decoder of claim 8, wherein the scheduler generates the plurality of variable node groups by grouping the plurality of variable nodes, which have been sorted in an order of the codewords, into a set number of groups, and determines the update order such that a variable node group with lower reliability among the plurality of variable node groups is updated before a variable node group with higher reliability.

15. The LDPC decoder of claim 14, wherein the set number is determined based on the maximum number of variable nodes that are updatable by the main decoder in one local iteration.

16. A low density parity check (LDPC) decoding device comprising:
a scheduler configured to group a plurality of variable nodes based on error information to generate multiple variable node groups, and determine the order of decoding the variable node groups based on the number of errors associated with each variable node group, such that a variable node group with a higher number of errors is decoded before a variable node group with lower number of errors; and
a decoder configured to decode the multiple variable node groups based on the decoding order.

* * * * *